(12) United States Patent
Muka et al.

(10) Patent No.: US 6,299,404 B1
(45) Date of Patent: Oct. 9, 2001

(54) SUBSTRATE TRANSPORT APPARATUS WITH DOUBLE SUBSTRATE HOLDERS

(75) Inventors: Richard S. Muka, Topsfield; James C. Davis, Jr., Carlisle, both of MA (US); Christopher A. Hofmeister, Hampstead, NH (US)

(73) Assignee: Brooks Automation Inc., Chelmsford, MA (US)

( * ) Notice: Subject to any disclaimer, the term of this patent is extended or adjusted under 35 U.S.C. 154(b) by 450 days.

(21) Appl. No.: 08/587,087

(22) Filed: Jan. 16, 1996

Related U.S. Application Data

(63) Continuation-in-part of application No. 08/549,995, filed on Oct. 27, 1995, now Pat. No. 5,647,724.

(51) Int. Cl.⁷ .................................................. B25J 18/00
(52) U.S. Cl. ..................... 414/744.5; 901/15; 414/935; 294/87.1; 74/490.01
(58) Field of Search ................. 414/744.5, 744.6, 414/749, 752, 935, 937, 939, 217, 222; 901/15; 74/490.08, 490.09, 490.01; 294/87.1, 32

(56) References Cited

U.S. PATENT DOCUMENTS

| | | |
|---|---|---|
| 1,190,215 | 7/1916 | Becker . |
| 2,282,608 | 5/1942 | Rempel . |
| 3,272,350 * | 9/1966 | Pflaumer et al. .................. 294/32 X |
| 3,730,595 | 5/1973 | Yakubowski ........................ 302/2 R |
| 3,768,714 | 10/1973 | Applequist et al. ..................... 226/37 |
| 3,823,836 | 7/1974 | Cheney et al. .................. 214/16.4 R |
| 3,874,525 | 4/1975 | Hassan et al. ....................... 214/17 B |
| 4,062,463 | 12/1977 | Hillman et al. ....................... 214/301 |
| 4,094,722 | 6/1978 | Yamamoto et al. .................. 156/345 |
| 4,109,170 | 8/1978 | Fujita et al. ........................ 310/68 R |
| 4,208,159 | 6/1980 | Uehara et al. ........................ 414/225 |
| 4,381,965 | 5/1983 | Maher, Jr. et al. .................. 156/345 |
| 4,666,366 | 5/1987 | Davis .................................. 414/749 |
| 4,675,096 | 6/1987 | Tateishi et al. ...................... 204/298 |
| 4,721,971 | 1/1988 | Scott ................................... 354/105 |
| 4,730,975 | 3/1988 | Munakata ............................ 414/735 |
| 4,907,467 | 3/1990 | Toyoda et al. ......................... 74/479 |
| 4,909,701 | 3/1990 | Hardegen et al. .................... 414/749 |
| 4,951,601 | 8/1990 | Maydan et al. ...................... 118/719 |
| 5,046,909 * | 9/1991 | Murdoch ............................. 414/935 |
| 5,151,008 * | 9/1992 | Ishida et al. ....................... 414/744.5 |
| 5,180,276 * | 1/1993 | Hendrickson ........................ 414/752 |
| 5,183,370 * | 2/1993 | Cruz .................................. 414/937 X |
| 5,270,600 | 12/1993 | Hashimoto ......................... 310/75 D |
| 5,333,986 | 8/1994 | Mizukami et al. ................... 414/217 |
| 5,404,894 * | 4/1995 | Shiraiwa ........................... 414/937 X |
| 5,447,409 | 9/1995 | Grunes et al. ..................... 414/744.6 |

FOREIGN PATENT DOCUMENTS

| | | |
|---|---|---|
| 0423608 | 4/1991 | (EP) . |
| 2-292153 | 12/1990 | (JP) . |

\* cited by examiner

*Primary Examiner*—Donald W. Underwood
(74) *Attorney, Agent, or Firm*—Perman & Green, LLP

(57) ABSTRACT

A substrate processing apparatus having a supply of substrates, a substrate transport module, and a substrate processing module. The transport module has a movable arm assembly and two substrate holders mounted to the movable arm assembly. The substrate holders each have two separate holding areas for simultaneously holding two substrates. The movable arm assembly has two pairs of driven arms. Each pair of driven arms is connected to a separate one of the holders for extending and retracting the holders along a radial path relative to a center of the movable arm assembly.

6 Claims, 7 Drawing Sheets

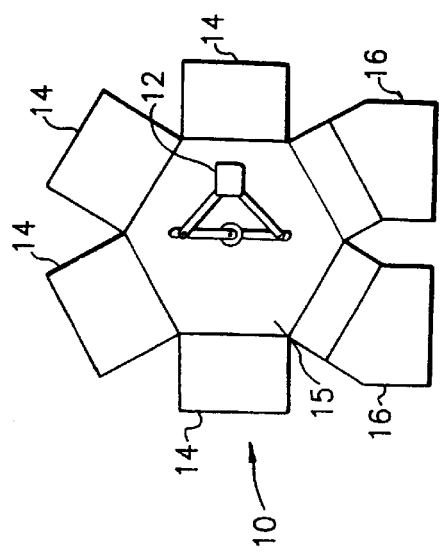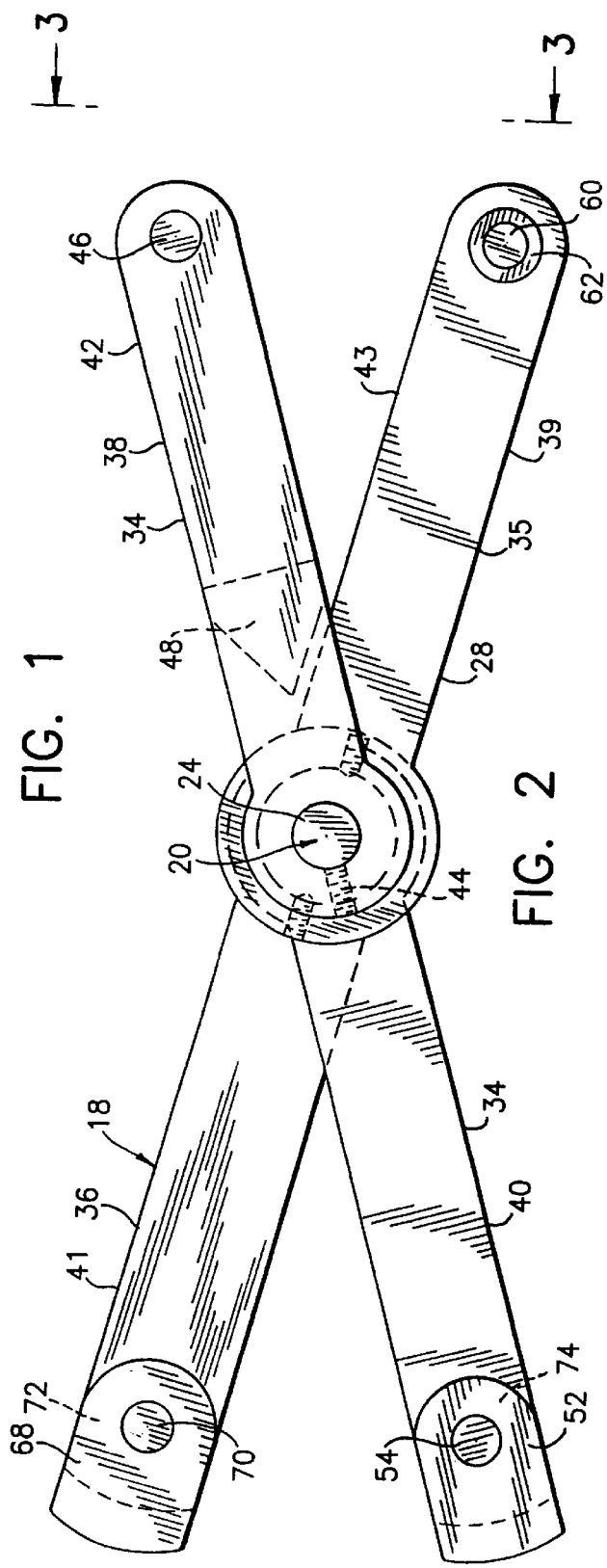

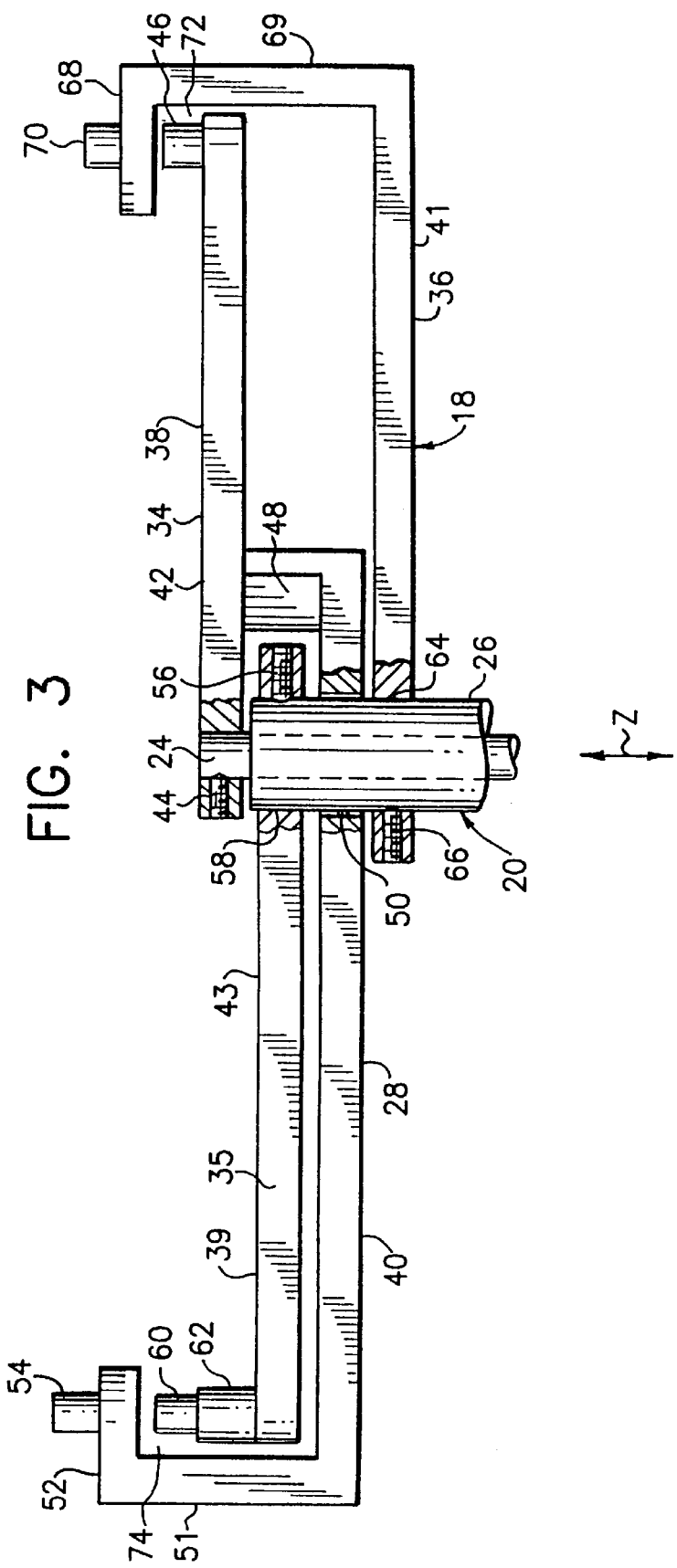

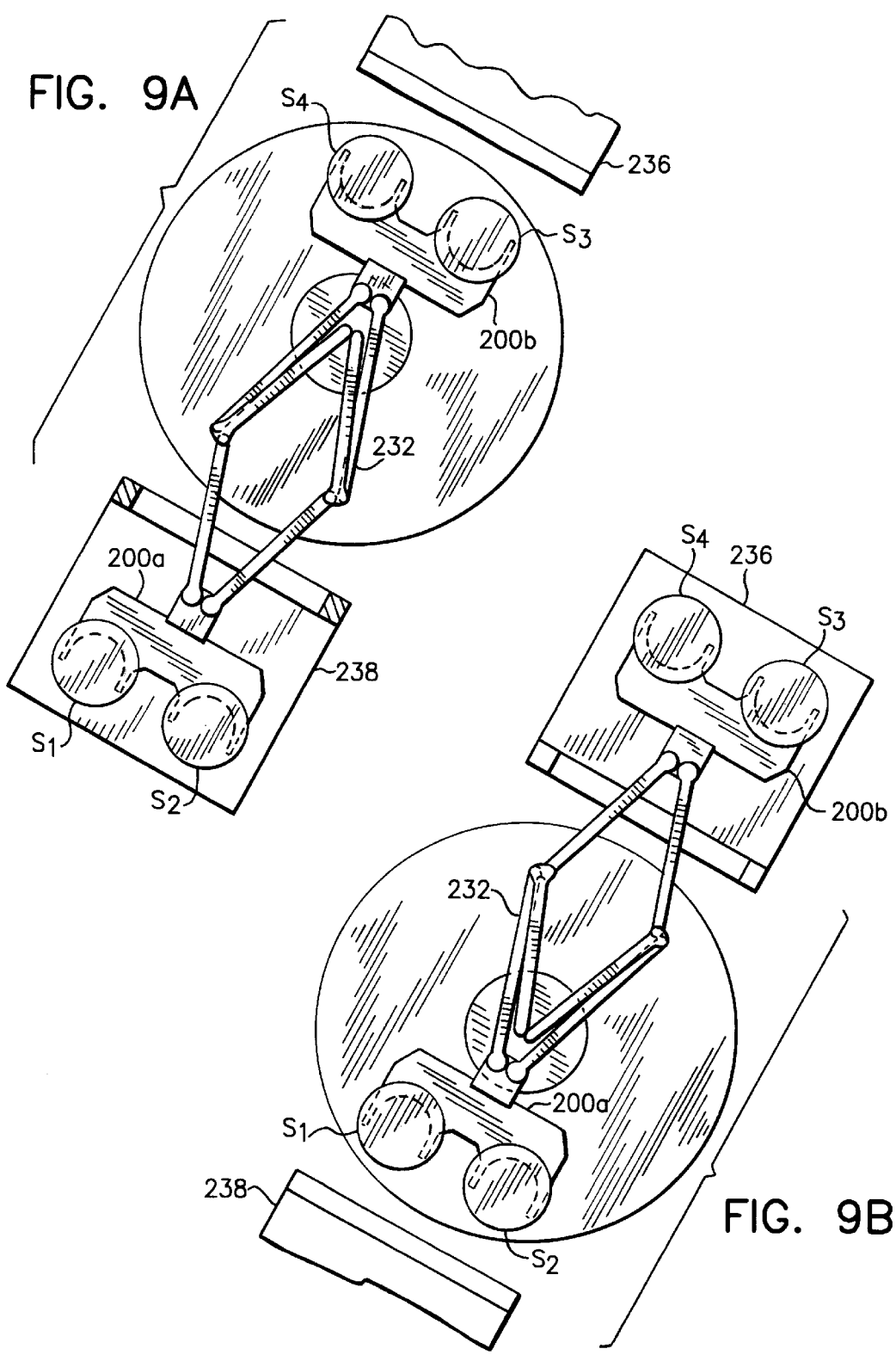

SUBSTRATE TRANSPORT APPARATUS WITH DOUBLE SUBSTRATE HOLDERS

CROSS-REFERENCE TO RELATED APPLICATION

This is a continuation-in-part application of U.S. patent application Ser. No. 08/549,995, filed Oct. 27, 1995, and now U.S. Pat. No. 5,647,724.

BACKGROUND OF THE INVENTION

1. Field of the Invention

This invention relates to a substrate processing apparatus and, more particularly, to a substrate transport with substrate holders each capable of transporting more than one substrate at the same time.

2. Prior Art

Mattson Technology has a system known as its ASPEN system that moves two semi-conductor wafers into and out of a process chamber at the same time. Batch systems, single wafer systems and cluster tool systems are also known in the prior art. U.S. Pat. No. 4,951,601 discloses a substrate processing apparatus with multiple processing chambers and a substrate transport apparatus. U.S. Pat. No. 5,180,276 discloses a substrate transport apparatus with two substrate holders. U.S. Pat. No. 5,270,600 discloses a coaxial drive shaft assembly of a substrate transport apparatus. U.S. Pat. No. 4,094,722 discloses a rotatable palette that holds four wafers. U.S. Pat. No. 4,381,965 discloses a multi-planar electrode plasma etcher. U.S. Pat. No. 4,675,096 discloses a take-in-and-out chamber with side-by-side take-in and take-out positions. Other related art include the following:

U.S. Pat. No. : 1,190,215 U.S. Pat. No. : 2,282,608
U.S. Pat. No. : 3,730,595 U.S. Pat. No. : 3,768,714
U.S. Pat. No. : 3,823,836 U.S. Pat. No. : 3,874,525
U.S. Pat. No. : 4,062,463 U.S. Pat. No. : 4,109,170
U.S. Pat. No. : 4,208,159 U.S. Pat. No. : 4,666,366
U.S. Pat. No. : 4,721,971 U.S. Pat. No. : 4,730,975
U.S. Pat. No. : 4,907,467 U.S. Pat. No. : 4,909,701
U.S. Pat. No. : 5,151,008 U.S. Pat. No. : 5,333,986
U.S. Pat. No. : 5,447,409
EPO Publication No.: 0423608
Japanese Publication No.: 2-292153

SUMMARY OF THE INVENTION

In accordance with one embodiment of the present invention, a substrate transport apparatus is provided comprising a movable arm assembly and two substrate holders. The movable arm assembly has two pairs of driven arms. The two substrate holders include a first holder which is suitably sized and shaped to simultaneously hold at least two spaced substrates thereon. Each substrate holder is individually connected to a separate one of the pairs of driven arms.

In accordance with another embodiment of the present invention, a substrate processing apparatus is provided comprising a supply of substrates, a substrate transport module, and a substrate processing module. The substrate transport module is connected to the supply of substrates and includes a movable arm assembly and two substrate holders mounted to the movable arm assembly for extension and retraction relative to a center of the movable arm assembly. A first one of the holders has two separate holding areas for simultaneously holding two substrates. The substrate processing module is connected to the substrate transport module and is suitably sized and shaped to simultaneously receive two substrates transported into the processing module by the movable arm assembly and the first holder. The substrate transport module can move more than two substrates without rotating the substrate holders about a center axis of the transport module.

In accordance with another embodiment of the present invention, a substrate transport apparatus is provided comprising a movable arm assembly and two substrate holders. The movable arm assembly has two drive arms and two pairs of driven arms. Each pair of driven arms has a first driven arm connected to a first one of the drive arms and a second driven arm connected to a second one of the drive arms. The two pairs of driven arms are generally located on opposite sides of the drive arms. The two substrate holders are individually connected to separate ones of the pairs of driven arms. The two substrate holders each have more than one separate substrate holding area for each of the holders to simultaneously hold more than one substrate at the same time.

In accordance with another embodiment of the present invention, a substrate holder for use with a substrate transport apparatus is provided comprising a frame member and a mount. The frame member has a general flat planar shape with two spaced apart recesses into a front end of the frame member. The mount is connected to the frame member for attaching the frame member to the transport apparatus.

DETAILED DESCRIPTION OF THE DRAWINGS

The foregoing aspects and other features of the invention are explained in the following description, taken in connection with the accompanying drawings, wherein:

FIG. 1 is a schematic top plan view of a substrate processing apparatus having a substrate transport apparatus incorporating features of the present invention;

FIG. 2 is a top plan view of an X-shaped section of a movable arm assembly of the substrate transport apparatus shown in FIG. 1;

FIG. 3 is an end view of the X-shaped section shown in FIG. 2 with a partial cut away section;

FIG. 9A is a schematic top plan view of the transparent apparatus shown in FIG. 8 at a first extended position;

FIG. 9B is a schematic top plan view as in FIG. 9A showing the transport apparatus at a second extended position;

DETAILED DESCRIPTION OF THE PREFERRED EMBODIMENTS

Figure 4A:
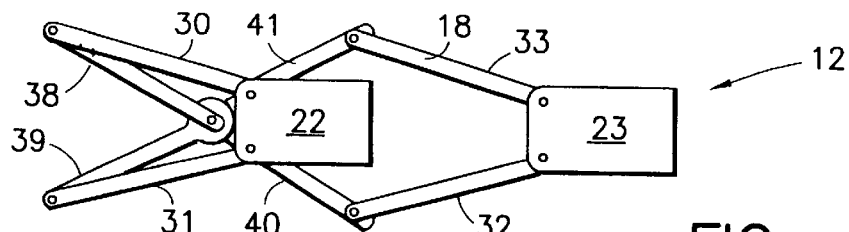
FIGS. 4A–4E are schematic top plan views of the substrate transport apparatus shown in FIG. 1 showing the movable arm assembly and the substrate holders at five different positions.

Referring to FIG. 1, there is shown a schematic top plan view of a substrate processing apparatus 10 having a substrate transport apparatus 12 incorporating features of the present invention. Although the present invention will be described with reference to the embodiments shown in the drawings, it should be understood that the present invention may be embodied in many forms of alternative embodiments. In addition, any suitable size, shape or type of materials or elements could be used.

In addition to the substrate transport apparatus 12, the substrate processing apparatus 10 includes multiple substrate processing chambers 14 and substrates cassette elevators 16 connected to a chamber 15. The transport apparatus 12 is located, at least partially, in the chamber 15 and is adapted to transport planar substrates, such as semiconductor wafers or flat panel displays, between and/or among the chambers 14 and elevators 16. In alternate embodiments, the transport apparatus 12 could be used in any suitable type of substrate processing apparatus.

Figure 4B:
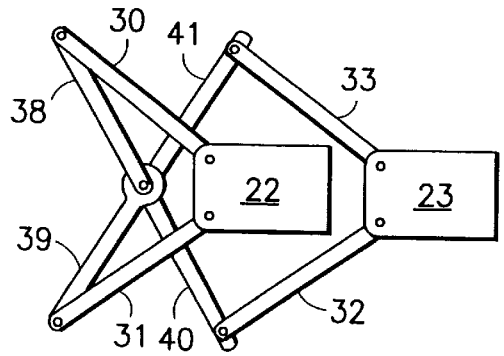
Figure 4C:
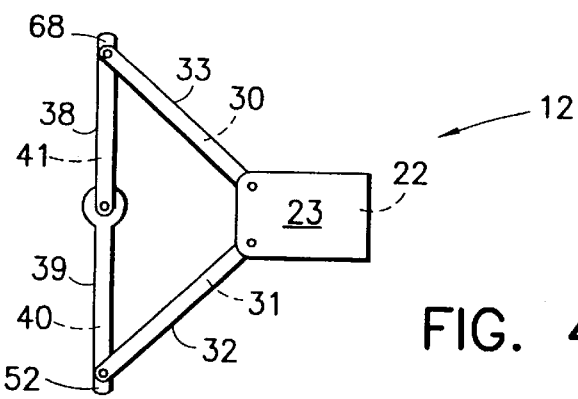
Figure 4D:
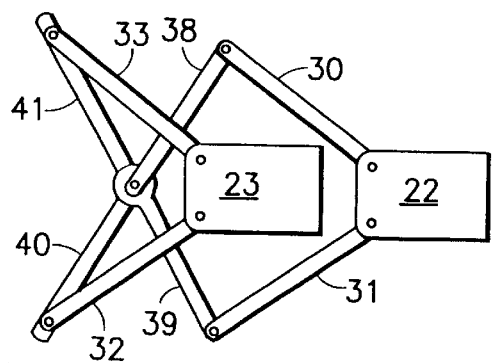
Figure 4E:
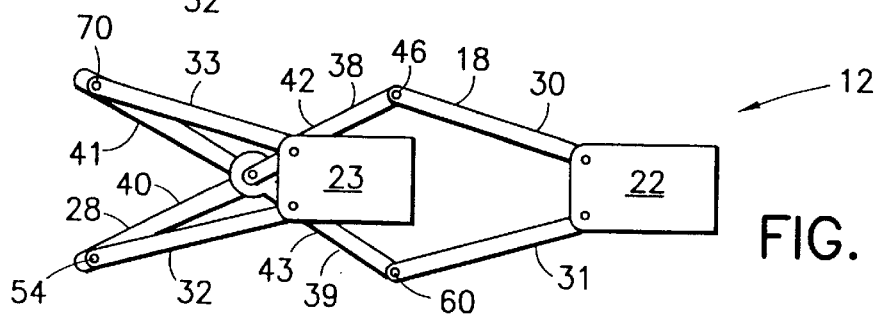

Referring also to FIGS. 2, 3 and 4E, the transport apparatus 12 generally comprises a movable arm assembly 18, a coaxial drive shaft assembly 20, and two substrate holders 22, 23. The coaxial drive shaft assembly 20 includes a first shaft 24 rotatably located inside a second shaft 26. The two shafts 24, 26 are axially rotatable in unison with each other in same directions and in opposite directions relative to each other and, are movable up and down with each other as indicated by arrow Z. One such coaxial drive shaft assembly is disclosed in U.S. Pat. No. 5,270,600 which is hereby incorporated by reference in its entirety. However, any suitable type of drive assembly could be used including a non-coaxial drive assembly or a coaxial drive assembly with more than two drive shafts.

The movable arm assembly 18 comprises a general X-shaped section 28 and four distal arms 30, 31, 32, 33. The distal arms 30, 31, 32, 33 connect the substrate holders 22, 23 to the X-shaped section 28. The X-shaped section 28 has three arm members 34, 35, 36 that form four proximal arm section 38, 39, 40, 41 of the two crossed arms 42, 43. The section 28 is referred to as being X-shaped. However, the two arms 42, 43 are movable relative to each other at their center connection to the drive shaft assembly 20. Thus, the X-shaped section 28 is a movable or reconfigurable X-shape. In one position, shown in FIGS. 1 and 4C, the X-shaped section looses its general X-shape because the two arms 42, 43 are directly aligned with each other. However, in all other non-aligned positions the section 28 has a general X-shaped profile. Thus, the section 28 is referred to herein as an X-shaped section for lack of a better descriptive term. The two crossed arms 42, 43 form the general X-shape. The first arm 42 comprises the first arm member 34 which forms the first and third arm sections 38, 40. The second arm 43 comprises the second and third arm members 35, 36 which form the second and fourth arm sections 39, 41.

As seen best in FIG. 3, the first arm member 34 is fixedly attached to the first drive shaft 24 by screw 44. The first arm section 38 has a pivot 46 at its distal end and is connected to the shaft assembly 20 at a first height. A stop 48 extends below the first arm section 38. The third arm section 40 is integral with the first arm section 38. The third arm section 40 has an aperture 50 that allows the drive shaft assembly 20 to pass therethrough. The third arm section 40 extends from the drive shaft assembly 20 at a third height on the assembly 20. Located at a distal end of the third arm section 40 is an upward extension 51 with an upper overhang section 52 having a pivot 54. The overhang section 52 extends inward towards the center of the X-shape. The second arm section 39 has an aperture 58 that allows the drive shaft assembly 20 to pass therethrough. The second arm section 39 is fixedly attached to the second drive shaft 26 by a screw 56. The second arm section 39 extends from the drive shaft assembly 20 at a second height on the assembly 20. Located at the distal end of the second arm section 39 is a pivot 60 on an upstanding post 62. The fourth arm section 41 has an aperture 64 that allows the drive shaft assembly 20 to pass therethrough. The fourth arm section 41 is fixedly attached to the second drive shaft 26 by a screw 66. The distal end of the fourth arm section 41 has an upward extension 69 with an upper overhang section 68 having a pivot 70. The fourth arm section 41 extends from the drive shaft assembly at a fourth height on the assembly 20. Thus, the four arm sections 38, 39, 40, 41 extend from the drive shaft assembly 20 at four different heights on the assembly 20. The third arm section 40 and the fourth arm section 41 form channels 72, 74 to allow the distal ends of the first and second arm sections 38, 39 to pass through.

As seen best in FIG. 4E, the first distal arm 30 has one end pivotably mounted on the first pivot 46 of the first arm section 38 and an opposite end pivotably mounted to the first substrate holder 22. The second distal arm 31 has one end pivotably mounted on the second pivot 60 of the second arm section 39 and an opposite end pivotably mounted to the first substrate holder 22. Thus, the first holder 22 is pivotably mounted to the pair of pivots 46, 60; one pivot from each of the crossed arms 42, 43 of the X-shaped section 28. The third distal arm 32 has one end pivotably mounted on the third pivot 54 of the third arm section 40 and an opposite end pivotably mounted to the second substrate holder 23. The fourth distal arm 33 has one end pivotably mounted on the fourth pivot 70 of the fourth arm section 41 and an opposite end pivotably mounted to the second substrate holder 23. Thus, the second holder 23 is pivotably mounted to the pair of pivots 54, 70; one pivot from each of the crossed arms 42, 43 of the X-shaped section 28. In alternate embodiments other types of connections of the distal arms to the X-shaped section 28 and/or the holders 22, 23 could be provided. Connectors or a connecting assembly different than the distal arms 30, 31, 32, 33 could also be provided.

The first pair of pivots 46, 60 and their corresponding distal arms 30, 31 are located in a first relative lower plane of movement. The first substrate holder 22 is also located in this first relative lower plane. The second pair of pivots 54, 70 and their corresponding distal arms 32, 33 are located in a second relative upper plane of movement. The second substrate holder 23 is also located in this second relative upper plane. In a preferred embodiment the first pair of distal arms 30, 31 has intermeshed gear sections at holder 22 for registry of movement to keep the holder 22 in a constant orientation. The second pair of distal arms 32, 33 also preferably has intermeshed gear sections at holder 23 for registry of movement to keep the holder 23 in a constant orientation. However, any suitable type of system to keep the holders 22, 23 properly orientated could be used.

The substrate holders 22, 23 are adapted to be inserted and removed from the chambers 14 and elevators. 16. The holders 22, 23 are adapted to hold substrates thereon and thereby allow the substrates to be moved between and/or among the chambers 14 and elevators 16. Suitable means are provided (not shown) for keeping the substrate holders aligned with the movable arm assembly 18 such that the holders 22, 23 are always pointed in an outward direction for proper straight insertion into a chamber or elevator. This can include the ends of the distal arms 30, 31, 32, 33 at the holders 22, 23 having intermeshed gear teeth or an S-band joint constraint, such as described in U.S. patent application Ser. No. 08/421,533 entitled "Articulated Arm Transfer Device", which is hereby incorporated by reference in its entirely. In alternate embodiments any suitable type of substrate holders or orientation constraint could be used.

Referring now to FIGS. 4A–4E, the operation of the substrate movement apparatus 12 will be described. FIG. 4C and FIG. 1 show the apparatus 12 at a home position. In this home position both drive shafts 24, 26 can be rotated in the same direction to rotate the holders 22, 23 in front of a selected one of the chambers 14 or elevators 16. In this home position, the upper holder 23 is located above the lower holder 22. Distal arm 33 is located over distal arm 30. Distal arm 32 is located over distal arm 31. First arm section 38 is located over the fourth arm section 41 except for overhang section 68. Second arm section 39 is located over the third arm section 40 except for overhang section 52.

FIG. 4A shows the upper holder 23 in an extended position with the lower holder 22 in a retracted position. FIG. 4B shows an intermediate position of the apparatus 12 between the home position shown in FIG. 4C and the upper holder extended position shown in FIG. 4A. In order to move between these two positions, the two drive shafts 24, 26 are axially rotated in reverse directions relative to each other. FIG. 4E shows the lower holder 22 in an extended position with the upper holder 23 in a retracted position. FIG. 4D shows an intermediate position of the apparatus 12 between the home position shown in FIG. 4C and the lower holder extended position shown in FIG. 4E. The two holders 22, 23 are moved in opposite unison between their extended positions and their home positions with the upper holder 23 moving in a plane above the lower holder 22. The movable arm assembly 18 allows sufficient room for the holder being retracted to move closer to the center of the X-shaped section. The stop 48 limits axial rotation of the two crossed arms 42, 43 relative to each other. The movable arm assembly 18 is designed to allow each arm 42, 43 to rotate about 160°. However, in alternate embodiments other degrees of rotation could be provided. The X-shaped section 28 has been designed to allow unobstructed movement of the arm sections 38, 39, 40, 41 between the positions shown in FIGS. 4A and 4E and unobstructed movement of the distal arms and holders in their two different relative planes of motion. This allows the two holders 22, 23 to be positioned on the same side of the assembly 18. The two pairs of distal arms 30, 31 and 32, 33 function as forearm sections for their respective substrate holders 22, 23. In alternate embodiments more than two substrate holders could be provided and/or, could be located on additional sides of the assembly 12. The drive shaft assembly 20 vertically moves the holders 22, 23 in direction Z (see FIG. 3) to align the holder to be extended with the opening of the intended receiving chamber 14 or elevator 16. Positioning the two holders 22, 23 on the same side of the assembly can speed-up throughput in the substrate processing apparatus 10. Positioning of the holders 22, 23 on the same side of the apparatus 12 is accomplished by allowing the holders to move along substantially parallel paths, one holder above the other, with one moving in a plane over the other.

Figure 5:
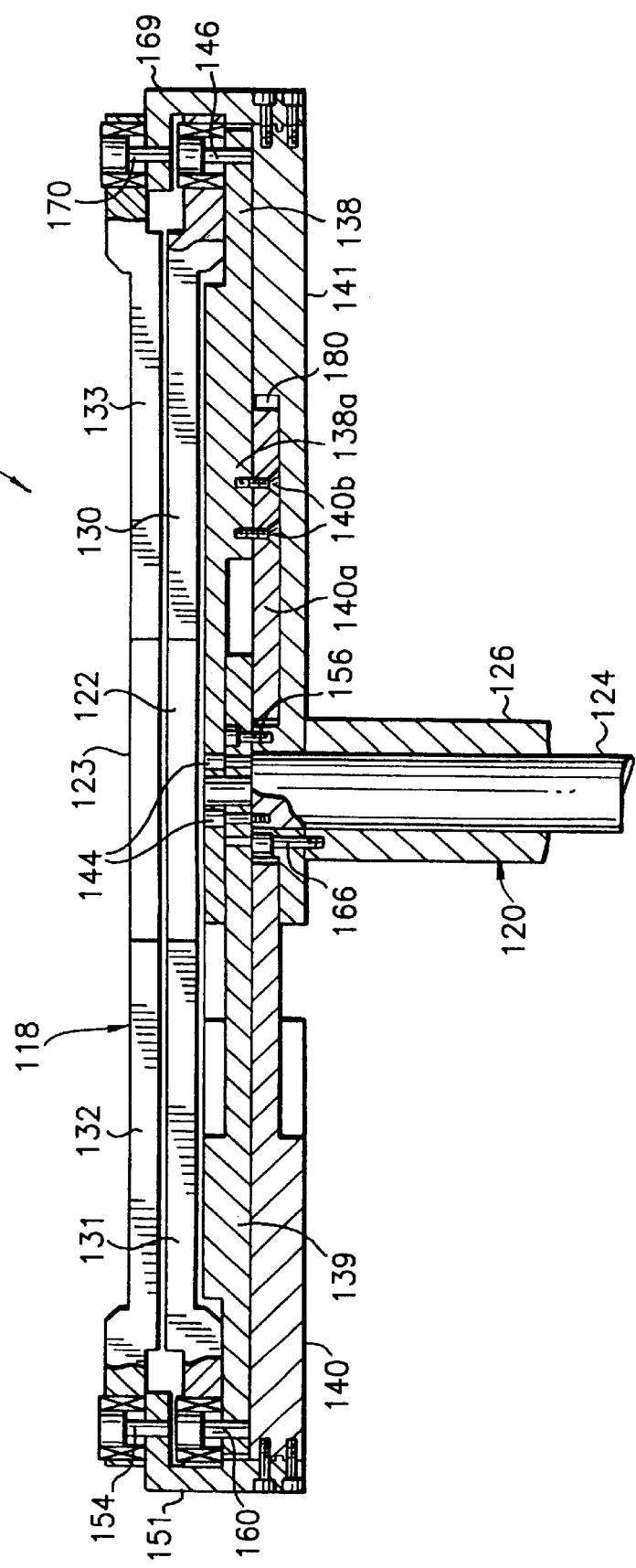
FIG. 5 is an end view with partial cut away sections of an alternate embodiment of the present invention.

Referring now to FIG. 5, there is shown an alternate embodiment of the present invention. The transport apparatus 112 has a coaxial drive shaft assembly 120 with two drive shafts 124, 126. The movable arm assembly 118 has four drive arms 138, 139, 140, 141 and four driven arms or forearms 130, 131, 132, 133. Two holders 122, 123 are attached to ends of the forearms 130, 131, 132, 133. In this embodiment, the second and fourth drive arms 139 and 141 are fixedly connected to each other by fasteners 156 (only one of which is shown). The fourth drive arm 141 is fixedly attached to the top of the outer drive shaft 126 by fasteners 166 (only one of which is shown). Thus, when the outer drive shaft 126 is moved, the second and fourth drive arms 139, 141 are moved. The third drive arm 140 has a section 140a that fasteners 140b are attached to. The fasteners 140b are also attached to section 138a of the first drive arm 138. This fixedly attaches the first drive arm 138 to the third drive arm 140. The fourth drive arm 141 has a pocket 180 to allow the section 140a to move therethrough. The first drive arm 138 is fixedly attached to the top of the inner drive shaft 124 by fasteners 144 (only two of which are shown). The third drive arm 140 has an extension 151 attached to it that has the pivot 154 thereon. Likewise, the fourth drive arm 141 has an extension 169 attached to it that has the pivot 170. The first and second drive arms 138, 139 also have pivots 146, 160, respectively. The four forearms 130, 131, 132, 133 are mounted on the pivots 146, 154, 160, 170 with suitable bearings. This embodiment is more compact than the embodiment shown in FIG. 3 and is easier to manufacture. There is also virtually no chance that the drive arms will move relative to their respective drive shafts.

In another alternate embodiment, two drive shaft assemblies could be used; one extending upward into the chamber 15 and one downward into the chamber 15. Referring to FIG. 1, because the driven arms can extend and retract in a single radial direction on one side of the drive shaft, the substrate holders can withdraw a substrate from one of the chambers 14 or elevator 16 and insert a substrate into the same chamber 14 or elevator 16 without rotating the substrate holders about the center axis of the drive shaft assembly. This can obviously save time in transporting substrates. The ability to have the driven arms and substrate holders on the same side of the drive shaft assembly is an important feature and improvement for the present invention.

Figure 6:
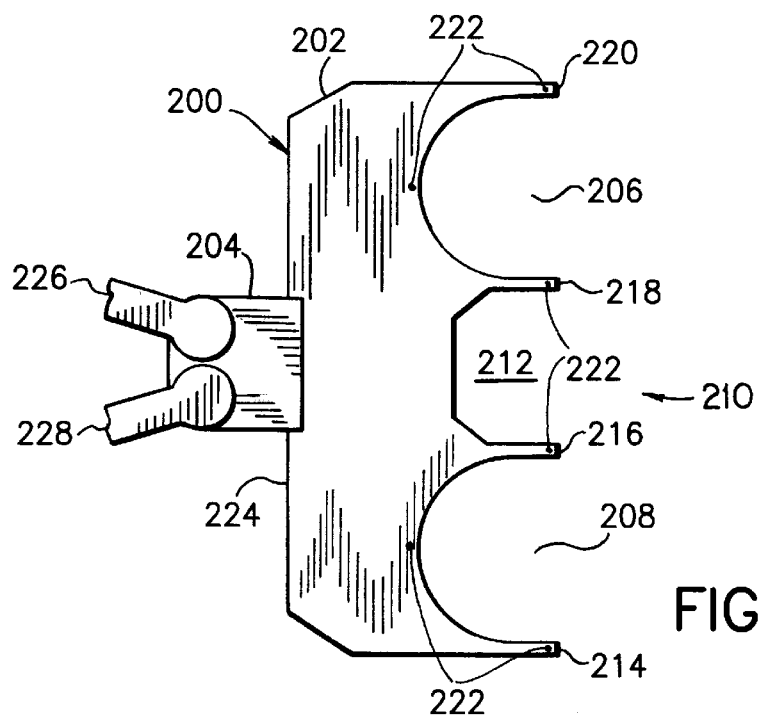
FIG. 6 is a top plan view of an alternate embodiment of a substrate holder.

Referring now to FIG. 6, an alternate embodiment of a substrate holder 200 is shown. The holder 200 generally comprises a frame 202 and a mount 204. The frame 202 has a general flat planar shape with two spaced apart recesses 206, 208 into a front end 210 of the frame 202. The frame 202 also has a third recess 212 in its front end 210 between the first and second recesses 206, 208. The front end 210, thus, has four forwardly extending arms 214, 216, 218, 220. Mounted to the frame 202 are six point contacts 222. The point contacts 222 are preferably comprised of quartz or diamond and extend above the top surface of the frame 202. Three point contacts 222 are provided at each of the first and second recesses 206, 208. Each arms 214, 216, 218, 200 has one of the point contacts 222 proximate its end. A point contact 222 is also located at the rear ends of each of the first and second recesses 206, 208. Substrates placed on the holder 200 rest on the point contacts 222; not directly on the frame 202. However, in alternate embodiments any suitable type of system can be used to locate or mount substrates to the holder 200. The frame and point contacts, in the embodiment shown, are suitably configured to hold up to two substrates at the same time; one above the first recess 206 and another above the second recess 208. The holder 200 is adapted to hold the two substrates in a same plane above and parallel to the frame 202 and in a side-by-side configuration. In alternate embodiments, the frame 202 could have other shapes dependent upon how many substrates it can carry and the shape of the processor and elevator modules it is intended to be inserted into. The mount 204 is fixedly connected to the rear end 224 of the frame 202. In an alternate embodiment the mount could be an integral part of the frame rather than a member attached to the frame. The mount 204 has two driven arms 226, 228 pivotably connected to it. Preferably, suitable means (not shown) are provided at the mount 204 for constraining the driven arms 226, 228 such that they move in registration with each other, such as intermeshing gear teeth or a dual S-band constraint.

Figure 7:
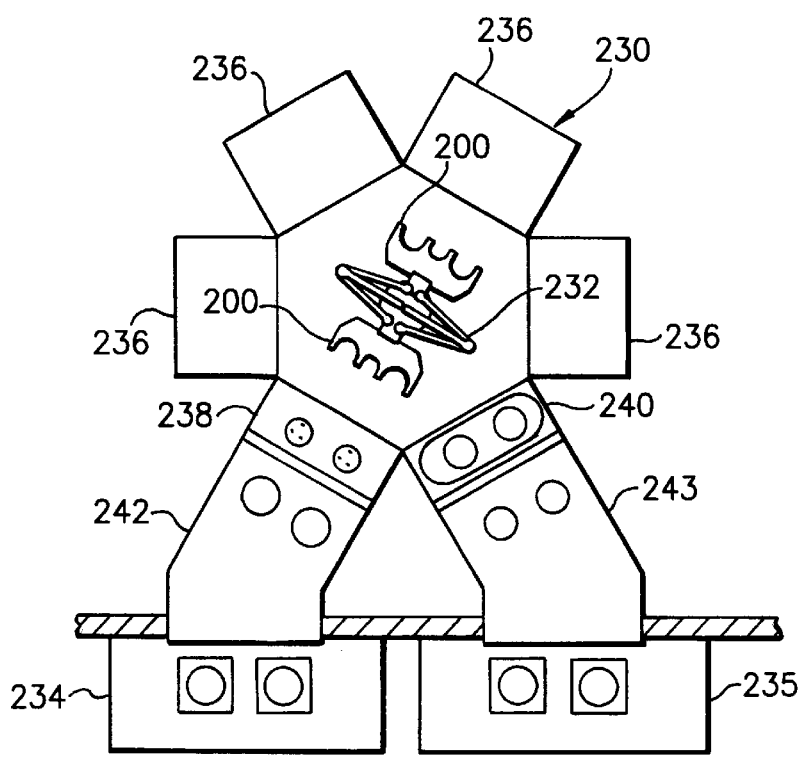
FIG. 7 is a schematic top plan view of a substrate processing apparatus using two of the holders shown in FIG. 6.

Referring also to FIG. 7, there is shown a substrate processing apparatus 230 having a substrate transport apparatus 232 with two of the substrate holders 200. The processing apparatus 230 is similar to the apparatus 10 shown in FIG. 1, but has two dual substrate cassette elevators 234, 235, four dual substrate processing chambers 236, a dual aligner 238, a dual incooler 240, and two dual substrate transports 242, 243. The first transport 242 transports two subsubstrates at a time from the first elevator 234 to the aligner 238. The second transport 243 transports two substrates at a time from the incooler 240 to the cassettes in the second elevator 235.

Figure 8:
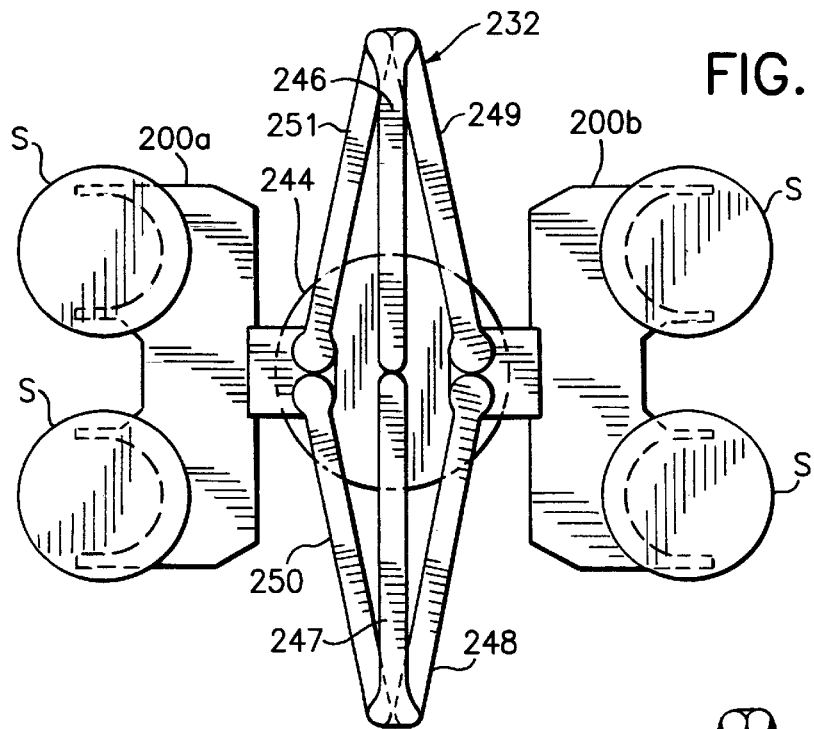
FIG. 8 is an enlarged top plan view of the transport apparatus shown in FIG. 7 having four substrates thereon.

Referring also to FIG. 8, the substrate transport apparatus 232 is shown holding four substrates S. The transport apparatus 232, in the embodiment shown, includes a drive 244 and a movable arm assembly with two drive arms 246, 247 and four driven arms 248, 249, 250, 251. Preferably, the drive is a coaxial drive shaft assembly such as described in U.S. patent application Ser. No. 08/434,012, now U.S. Pat. No. 5,720,590, which is hereby incorporated by reference in its entirety. However, any suitable type of drive could be used. A similar drive arm assembly is described in U.S. Pat. No. 5,180,276 which is hereby incorporated by reference in its entirety. In the embodiment shown in FIG. 8, mounted to the ends of the two sets of driven arms 248, 249 and 250, 251 are the two substrate holders 200a and 200b. FIGS. 7 and 8 shows the transport apparatus 232 at a home position. Referring to FIGS. 9A and 9B the transport apparatus is shown at two different extended positions. In the first extended position shown in FIG. 9A, the first holder 200a is moved into the aligner 238 to remove the two substrates $S_1$ and $S_2$. In the second extended position shown in FIG. 9B the first holder 200a has been retracted out of the aligner 238 and the second holder 200b has been inserted into the processing chamber 236 to deliver the two substrates $S_3$ and $S_4$. This illustrates that the transport apparatus 232 and holders 200 can move more than two substrates without rotating the holders 200 about a center axis of the transport apparatus.

From the foregoing description it should be evident that the holder 200 allows for twice the substrate throughput as a single substrate holder. However, the expected increase in size of the footprint of the substrate processing apparatus is only about 40%. In addition, the increase in cost for manufacturing this type of substrate processing apparatus is expected to be only about 30% more than an apparatus with single substrate holders. Thus, throughput can be increased 100% with an increase in footprint of only 40% and increase in cost of only 30%. In addition, the dual substrate holder 200 in combination with the same side transport apparatus 12 can further increase throughput more than 100% due to the fact that the movable arm assembly 18 does not need to be rotated to remove substrates from a chamber and insert new substrates into the chamber.

Figure 10:
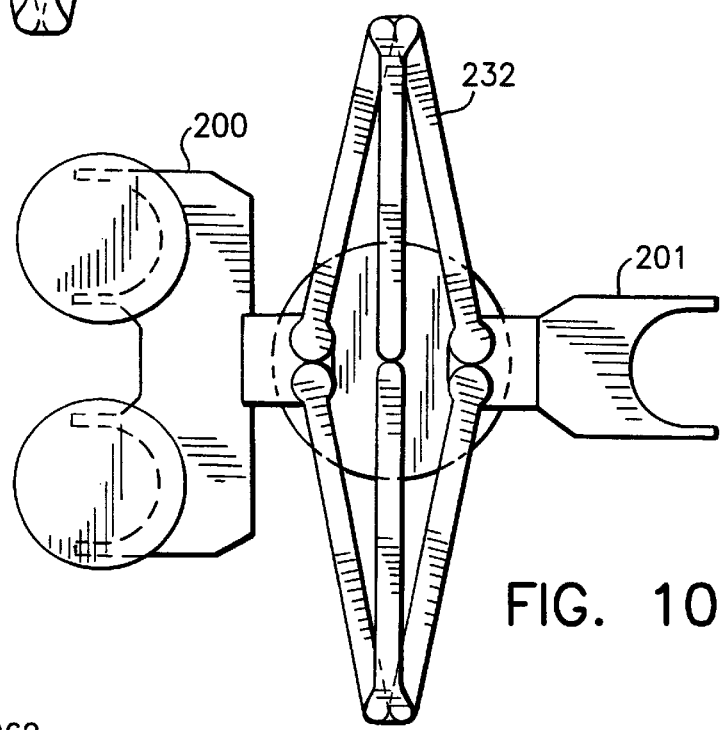
FIG. 10 is a schematic top plan view of an alternate embodiment of a transport apparatus having two different types of substrate holders.
Figure 11:
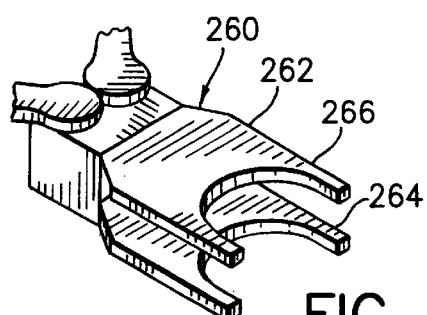
FIG. 11 is a perspective view of another alternate embodiment of a substrate holder.

Referring now to FIG. 10, there is shown an alternate embodiment of the present invention. In this embodiment the transport apparatus 232 includes two different substrate holders 200 and 201. The second substrate holder 201 is for carrying a single substrate. Referring to FIG. 11, there is shown a perspective view of another embodiment of a substrate holder 260 for carrying two substrates. However, in this embodiment, the frame 262 is suitably configured to hold the substrates in a vertically offset parallel or stacked configuration; one on bottom frame section 264 and one on top frame section 266. However, any suitable frame configuration could be used.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A substrate transport apparatus comprising:
   a movable arm assembly having two pairs of driven arms;
   a coaxial drive shaft assembly connected to the movable arm assembly; and
   two substrate holders, a first one of the substrate holders being suitably sized and shaped to simultaneously hold at least two spaced substrates thereon and each substrate holder being individually connected to a separate one of the pairs of driven arms,
   wherein the two substrate holders are always located on a same side of the movable arm assembly.

2. An apparatus as in claim 1 wherein the two substrate holders are located in parallel planes with one of the holders located above the other holder.

3. An apparatus as in claim 1 wherein both substrate holders are suitably sized and shaped to simultaneously hold at least two spaced substrates thereon.

4. An apparatus as in claim 1 wherein the first substrate holder has two side-by-side substrate holding areas for holding two planar substrate in a same plane next to each other.

5. An apparatus as in claim 1 wherein the first substrate holder has two substrate holding areas with one of the areas being located above the other area for holding two planar substrates in parallel planes with one of the substrates being located above the other substrate.

6. A substrate transport apparatus comprising:
   a movable arm assembly having two pairs of driven arms; and
   two substrate holders, a first one of the substrate holders being suitably sized and shaped to simultaneously hold at least two spaced substrates thereon and each substrate holder being individually connected to a separate one of the pairs of driven arms,
   wherein the two substrate holders are always located on a same lateral side of the movable arm assembly.

* * * * *